(12) United States Patent
Song

(10) Patent No.: US 9,153,593 B1
(45) Date of Patent: Oct. 6, 2015

(54) NONVOLATILE MEMORY DEVICE HAVING SINGLE-LAYER GATE, METHOD OF OPERATING THE SAME, AND MEMORY CELL ARRAY THEREOF

(71) Applicant: SK hynix Inc., Gyeonggi-do (KR)

(72) Inventor: Hyun Min Song, Chungcheongbuk-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/341,539

(22) Filed: Jul. 25, 2014

(30) Foreign Application Priority Data

Apr. 18, 2014 (KR) .......................... 10-2014-0046993

(51) Int. Cl.
*G11C 16/04* (2006.01)
*H01L 27/115* (2006.01)
*G11C 7/00* (2006.01)
*H01L 29/78* (2006.01)
*H01L 49/02* (2006.01)
*H01L 29/861* (2006.01)
*H01L 29/423* (2006.01)
*G11C 16/26* (2006.01)
*G11C 16/10* (2006.01)

(52) U.S. Cl.
CPC ................ *H01L 27/115* (2013.01); *G11C 7/00* (2013.01); *G11C 16/10* (2013.01); *G11C 16/26* (2013.01); *H01L 27/11526* (2013.01); *H01L 28/40* (2013.01); *H01L 29/4232* (2013.01); *H01L 29/78* (2013.01); *H01L 29/861* (2013.01)

(58) Field of Classification Search
USPC ................ 365/185.05, 185.1, 185.26, 185.2; 257/314, 315
See application file for complete search history.

(56) References Cited

U.S. PATENT DOCUMENTS

| | | | |
|---|---|---|---|
| 6,930,002 B1 | 8/2005 | Chen et al. | |
| 2004/0062108 A1 * | 4/2004 | Dray et al. | ..................... 365/202 |
| 2005/0219912 A1 * | 10/2005 | Gendrier et al. | ......... 365/185.29 |
| 2007/0120175 A1 * | 5/2007 | Tanaka | .......................... 257/315 |

* cited by examiner

*Primary Examiner* — Vu Le
(74) *Attorney, Agent, or Firm* — IP & T Group LLP

(57) ABSTRACT

A nonvolatile memory device includes a single-layer gate, a first area, and a second area. The first area includes a first well region, a first contact region arranged in the first well region, and source and drain regions arranged at both sides of the single-layer gate in the first well region. The second area includes a second well region, a second contact region arranged to overlap a part of the single-layer gate in the second well region, and a third contact region arranged in the second well region.

20 Claims, 6 Drawing Sheets

FIG.6

|  | WBL | TNL | BL | SL |
|---|---|---|---|---|
| PROGRAM | $V_{pp}$ | 0V | | |
| ERASE | 0V | $V_{ee}$ | | |
| READ | 0V | 0V | $V_{dd}$ | 0V |

FIG.8

| | | WBL | TNL | BL0 | BL1 | SL |
|---|---|---|---|---|---|---|
| PROGRAM | SELECTED UNIT CELL (700) | $V_{pp}$ | 0V | | | |
| | NON-SELECTED UNIT CELL (SHARING WBL) | $V_{pp}$ | FLOATING | | | |
| | NON-SELECTED UNIT CELL (SHARING TNL) | FLOATING | 0V | | | |
| ERASE | SELECTED UNIT CELL (700) | 0V | $V_{ee}$ | | | |
| | NON-SELECTED UNIT CELL (SHARING WBL) | 0V | FLOATING | | | |
| | NON-SELECTED UNIT CELL (SHARING TNL) | FLOATING | $V_{ee}$ | | | |
| READ | SELECTED UNIT CELL (700) | 0V | 0V | FLOATING | $V_{dd}$ | 0V |
| | NON-SELECTED UNIT CELL (SHARING BL) | 0V | FLOATING | FLOATING | $V_{dd}$ | FLOATING |
| | NON-SELECTED UNIT CELL (SHARING SL) | 0V | FLOATING | FLOATING | FLOATING | 0V |
| | NON-SELECTED UNIT CELL (SHARING TNL) | FLOATING | 0V | FLOATING | FLOATING | FLOATING |

NONVOLATILE MEMORY DEVICE HAVING SINGLE-LAYER GATE, METHOD OF OPERATING THE SAME, AND MEMORY CELL ARRAY THEREOF

CROSS-REFERENCES TO RELATED APPLICATIONS

The present application claims priority under 35 U.S.C. 119(a) to Korean Application No. 10-2014-0046993, filed on Apr. 18, 2014, in the Korean Intellectual Property Office, which is incorporated herein by reference in its entirety.

BACKGROUND

Various embodiments of the present disclosure relate to a nonvolatile memory device, a method of operating the same, and a memory cell array thereof and, more particularly, to a nonvolatile memory device having a single-layer gate, a method of operating the same, and a memory cell array thereof.

Various nonvolatile memory cell and memory cell array structures have been proposed for a memory device in which data stored in the memory cells is retained without access to power. In the conventional memory cell structure of a nonvolatile memory device, a stacked gate structure in which a gate insulating layer, a floating gate, an inter-gate insulating layer, and a control gate are sequentially arranged in a vertical direction has generally been employed. However, as the size of electronic apparatus continues to shrink and fabrication technology is developed, semiconductor devices capable of performing various functions have been embedded in one semiconductor chip. This type of semiconductor chip layout, called a system on chip (SoC), includes logic devices and memory devices and has emerged as a core part of advanced digital products. A fabrication technology of an embedded nonvolatile memory device embedded in a system on chip (SoC) has been developed.

The embedded nonvolatile memory device embedded in the system on chip (SoC) is fabricated in process steps that are the same as those of the logic devices of the system on chip (SoC). The nonvolatile memory device may employ a transistor with a stacked gate structure, while the logic devices employ a transistor with a single gate structure. When the nonvolatile memory device with a stacked gate structure and the logic devices with a single gate structure are embedded in the same substrate, the fabrication process thereof becomes very complicated. Therefore, attempts have been made to employ a single-layer gate in a nonvolatile memory device instead of the stacked gate structure. In employing a nonvolatile memory device having a single-layer gate, the system on chip (SoC) may be easily fabricated through the general fabrication processes of complementary metal oxide semiconductors (CMOS) used when fabricating logic devices.

SUMMARY

Various embodiments are directed to a nonvolatile memory device having a single-layer gate, a method of operating the same, and a memory cell array thereof.

According to an embodiment of the inventive concept, a nonvolatile memory device includes a single-layer gate, a first area including a first well region, a first contact region arranged in the first well region, and source and drain regions arranged at both sides of the single-layer gate in the first well region, a second area including a second well region, a second contact region arranged to overlap a part of the single-layer gate in the second well region, and a third contact region arranged in the second well region, wherein the first and second well regions and the first and third contact regions have a first conductivity while the second contact region and the source and drain regions have a second conductivity.

According to an embodiment of the inventive concept, a nonvolatile memory device includes a single-layer gate, a tunneling line connected to the single-layer gate through a tunneling capacitor and a first diode, a well bias line connected to the single-layer gate through a coupling capacitor, and a bit line and a source line connected to the well bias line through a second diode and a third diode, respectively.

According to an embodiment of the inventive concept, a method of operating a nonvolatile memory device including a unit cell of a single-layer gate includes performing program and erase operations of the unit cell by applying first voltages to a well bias line connected to the single-layer gate through a coupling capacitor and a tunneling line connected to the single-layer gate through a tunneling capacitor and a first diode, and performing a read operation of the unit cell by applying second voltages to the well bias line, the tunneling line and bit and source lines connected to the well bias line through second and third diode, respectively.

According to an embodiment of the inventive concept, a cell array of a nonvolatile memory device includes a plurality of first well regions arranged in a first direction to be spaced apart from each other while extending in a second direction, a plurality of active areas arranged in the second direction to be spaced apart from each other in each of the plurality of first well regions, a source region and a drain region arranged in each of the active areas, a first contact region arranged to be spaced apart from the active areas in each of the plurality of first well regions, a plurality of second well regions arranged in the second direction between the first well regions to be spaced apart from each other, a second contact region and a third contact region arranged in each of the second well regions, and a single-layer gate extending in the first direction to overlap the first well region at a first end thereof and the second contact region at a second end thereof.

BRIEF DESCRIPTION OF THE DRAWINGS

Various embodiments of the inventive concept will become more apparent in view of the attached drawings and the accompanying detailed description, in which:

FIG. 6 is a table for explaining an operation of a nonvolatile memory device of FIGS. 1 to 5;
FIG. 8 is a table for explaining an operation method of a nonvolatile memory device of FIG. 7.

DESCRIPTION OF SPECIFIC EMBODIMENTS

Detailed Description

Figure 1:
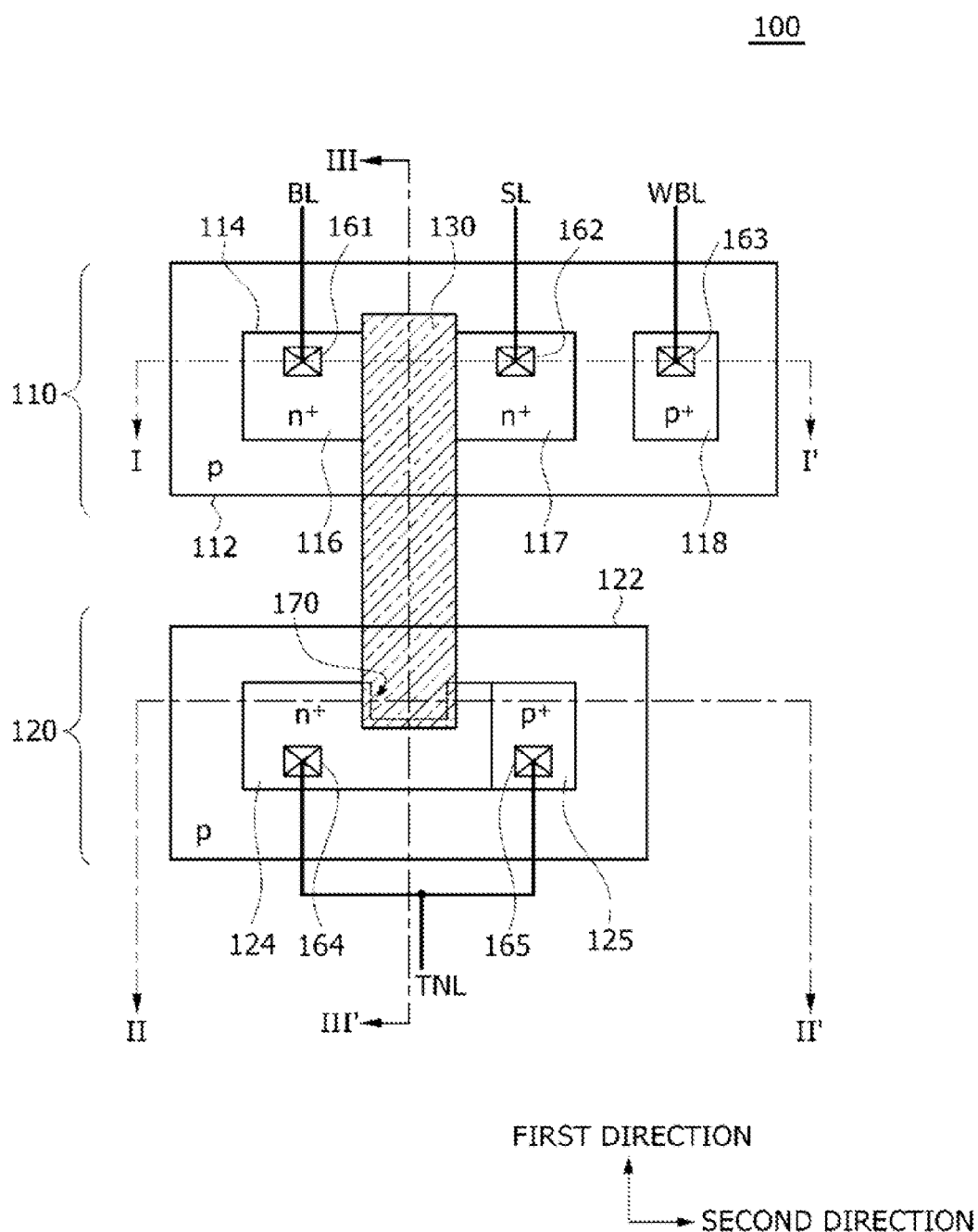
FIG. 1 is a layout diagram illustrating a nonvolatile memory device having a single-layer gate according to an embodiment of the present disclosure.

Various embodiments will be described below in more detail with reference to the accompanying drawings. The present invention may however, be embodied in different forms and should not be construed as limited to the embodiments set forth herein. Rather, these embodiments are provided so that this disclosure will be thorough and complete and will fully convey the scope of the present invention to those skilled in the art. The drawings are not necessarily to scale and, in some instances, proportions may have been exaggerated in order to clearly illustrate features of the embodiments. Throughout the disclosure, like reference numerals correspond directly to the like parts in the various figures and embodiments of the present invention.

In the present disclosure, it will be understood that when an element is referred to as being located "on", "over", "above", "under", "beneath" or "below" another element, it may directly contact the other element, or at least one intervening element may be present therebetween. Accordingly, the terms such as "on", "over", "above", "under", "beneath", "below" and the like that are used herein are for the purpose of describing particular embodiments only and are not intended to limit the scope of the inventive concept.

Figure 2:
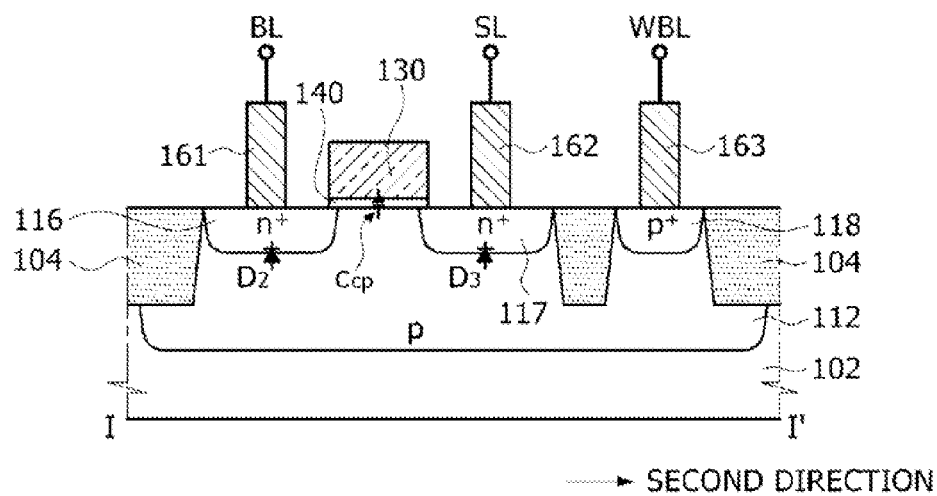
FIG. 2 is a sectional view taken along line I-I' of FIG. 1.
Figure 3:
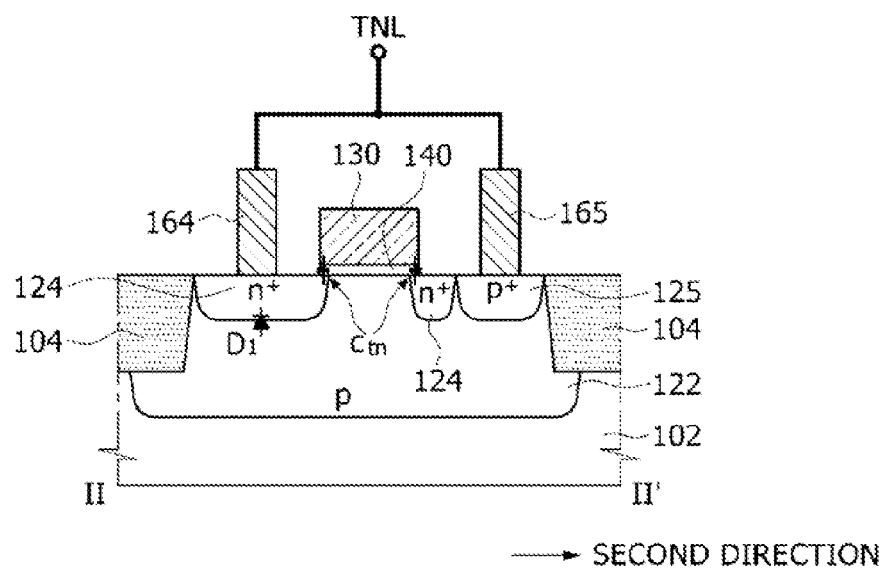
FIG. 3 is a sectional view taken along line II-II' of FIG. 1.
Figure 4:
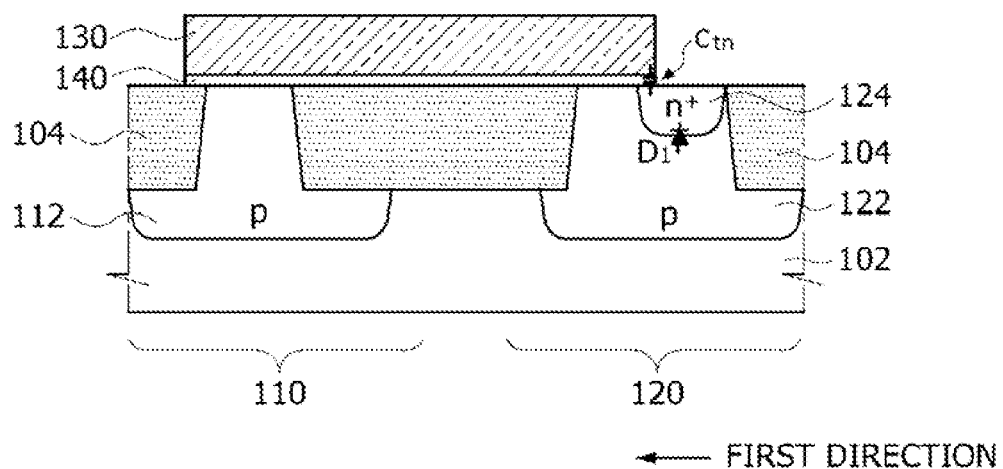
FIG. 4 is a sectional view taken along line III-III' of FIG. 1.

FIG. 1 is a layout diagram illustrating a nonvolatile memory device having a single-layer gate according to an embodiment of the present invention. FIGS. 2 to 4 are sectional views taken along lines I-I', II-II', and III-III' of FIG. 1, respectively. The same reference numerals in FIGS. 1 to 4 indicate the same elements.

Referring to FIG. 1, a nonvolatile memory device 100 includes a coupling capacitor/read transistor area 110 and a tunneling capacitor area 120. The coupling capacitor/read transistor area 110 and the tunneling capacitor area 120 are arranged to be spaced apart from each other and share a single-layer gate 130. The single-layer gate 130 may have a stripe structure extending in a first direction in FIG. 1. The coupling capacitor/read transistor area 110 overlaps a first end of the single-layer gate 130, and the tunneling capacitor area 120 overlaps a second end of the single-layer gate 130.

Referring to FIGS. 1 and 2, a coupling capacitor Ccp and a read transistor are arranged in the coupling capacitor/read transistor area 110. In detail, a first well region 112 is arranged in a predetermined area of an upper portion of a substrate 102. For example, the first well region 112 has a p-type conductivity. The first well region 112 is arranged to overlap the first end of the single-layer gate 130. An active area 114 and a first contact region 118 are arranged in a predetermined area of an upper portion of the first well region 112. The active area 114 and the first contact region 118 are arranged in a second direction to be spaced apart from each other. The active area 114 and the first contact region 118 may be defined by a trench isolation layer 104. For example, the first contact region 118 has a $p^+$-type conductivity that is more heavily doped than the first well region 112.

A drain region 116 and a source region 117 are arranged in the active area 114. For example, the drain region 116 and the source region 117 have an $n^+$-type conductivity. The drain region 116 and the source region 117 are arranged in the second direction to be spaced apart from each other. A surface of the first well region 112 between the drain region 116 and the source region 117 may serve as a channel region under predetermined conditions. In an embodiment, the drain region 116 and the source region 117 may be formed through the same implant process. In this case, the drain region 116 and the source region 117 may have substantially the same impurity doping concentration. The drain region 116 may constitute a second pn diode D2 together with the first well region 112. The source region 117 may constitute a third pn diode D3 together with the first well region 112. The drain region 116 is connected to a bit line BL through a first contact 161. The source region 117 is connected to a source line SL through a second contact 162. The first contact region 118 is connected to a well bias line WBL through a third contact 163.

A gate insulating layer 140 and the single-layer gate 130 are vertically arranged on the surface of the first well region 112 between the drain region 116 and the source region 117. For example, the gate insulating layer 140 may include an oxide layer. The first well region 112 and the single-layer gate 130, which overlap each other while having the gate insulating layer 140 interposed therebetween, constitute the coupling capacitor Ccp. The capacitance of the coupling capacitor Ccp may be decided by the material and thickness of the gate insulating layer 140, and an overlapping area of the first well region 112 and the single-layer gate 130. The drain region 116, the source region 117, the gate insulating layer 140, and the single-layer gate 130 constitute a read transistor with a metal oxide semiconductor (MOS) structure. The coupling capacitor Ccp performs a function of inducing a coupling voltage to the single-layer gate 130 in a program operation and an erase operation of the nonvolatile memory device 100. The read transistor functions to perform a read operation of the nonvolatile memory device 100.

Referring to FIGS. 1 and 3, a tunneling capacitor Ctn is arranged in the tunneling capacitor area 120. In detail, a second well region 122 is arranged in a predetermined area of the upper portion of the substrate 102. For example, the second well region 122 has a p-type conductivity. In an embodiment, the second well region 122 and the first well region 112 may be formed through the same implant process. In this case, the second well region 122 may have substantially the same impurity doping concentration as that of the first well region 112. A second contact region 124 and a third contact region 125 are arranged in an upper portion of the second well region 122. For example, the second contact region 124 has an $n^+$-type conductivity, and the third contact region 125 has a $p^+$-type conductivity that is more heavily doped than the second well region 122. In an embodiment, the second contact region 124 may be formed through the same implant process as that of the drain region 116 and the source region 117. In this case, the second contact region 124 may have substantially the same impurity doping concentration as that of the drain region 116 and the source region 117. The second contact region 124 may constitute a first pn diode D1 together with the second well region 122.

The second contact region 124 is connected to a tunneling line TNL through a fourth contact 164. The third contact region 125 is connected to the tunneling line TNL through a fifth contact 165. That is, the second contact region 124 and the third contact region 125 share the tunneling line TNL. Accordingly, the same bias voltage may be applied from the tunneling line TNL to the second contact region 124 and the third contact region 125. Consequently, as described in the embodiment, in order to reduce an area of the second well region 122 in which the second contact region 124 and the third contact region 125 are arranged, one side of the second contact region 124 may be in contact with one side of the third contact region 125. However, in other embodiments, the second contact region 124 and the third contact region 125 may be spaced apart from each other.

In FIG. 1, as indicated by a dotted line 170, the second contact region 124 overlaps an edge of the second end of the single-layer gate 130. The second contact region 124 and the single-layer gate 130, which overlap each other while having the gate insulating layer 140 interposed therebetween, constitute the tunneling capacitor Ctn. The capacitance of the tunneling capacitor Ctn may be decided by the material and thickness of the gate insulating layer 140, and an overlapping area of the second contact region 124 and the single-layer gate 130. The tunneling capacitor Ctn allows carriers to be tunneled to the single-layer gate 130 or from the single-layer gate 130 under predetermined conditions in the program operation and the erase operation of the nonvolatile memory device 100

Referring to FIG. 4 together with FIG. 1, the gate insulating layer 140 and the single-layer gate 130 are arranged to extend in the first direction. The one ends of the gate insulating layer 140 and the single-layer gate 130 in the first direction overlaps the coupling capacitor/read transistor area 110, and the other ends of the gate insulating layer 140 and the single-layer gate 130 overlaps the tunneling capacitor area 120. In the tunneling capacitor area 120, the other end of the single-layer gate 130 overlaps a part of the second contact region 124, and this overlapping part constitutes the tunneling capacitor Ctn as described with reference to FIG. 3.

Figure 5:
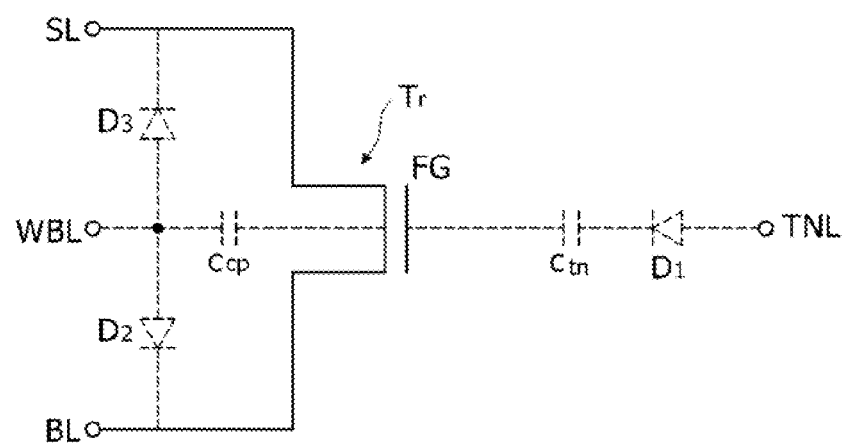
FIG. 5 is an equivalent circuit diagram of a nonvolatile memory device described with reference to FIGS. 1 to 4.

FIG. 5 is an equivalent circuit diagram of the nonvolatile memory device described with reference to FIGS. 1 to 4. Referring to FIG. 5, a source region and a drain region of a read transistor Tr having a single-layer gate FG are connected to the source line SL and the bit line BL, respectively. The single-layer gate FG arranged in a floating state is connected to a first terminal of the tunneling capacitor Ctn. A second terminal of the tunneling capacitor Ctn is connected to a cathode of the first pn diode DL. An anode of the first pn diode D1 is connected to the tunneling line TNL. As described with reference to FIG. 3, the tunneling capacitor Ctn includes the second contact region (124 of FIG. 3), the gate insulating layer (140 of FIG. 3), and the single-layer gate (130 of FIG. 3). The first pn diode D1 includes the pn junction of the second well region (122 of FIG. 3) and the second contact region (124 of FIG. 3).

The single-layer gate FG is connected to a first terminal of the coupling capacitor Ccp. A second terminal of the coupling capacitor Ccp is connected to an anode of the second pn diode D2 and an anode of the third pn diode D3. The second terminal of the coupling capacitor Ccp is connected to the well bias line WBL together with the anode of the second pn diode D2 and the anode of the third pn diode D3. The coupling capacitor Ccp and the tunneling capacitor Ctn are connected in parallel with each other on the basis of the single-layer gate FG. A cathode of the second pn diode D2 is connected to the bit line BL, and a cathode of the third pn diode D3 is connected to the source line SL. As described with reference to FIG. 2, the coupling capacitor Ccp includes the first well region (112 of FIG. 2), the gate insulating layer (140 of FIG. 2), and the single-layer gate (130 of FIG. 2). The second pn diode D2 includes the pn junction of the first well region (112 of FIG. 2) and the drain region (116 of FIG. 2). The third pn diode D3 includes the pn junction of the first well region (112 of FIG. 2) and the source region (117 of FIG. 2).

FIG. 6 is a table for explaining an operation of the nonvolatile memory device of FIGS. 1 to 5. Referring to FIG. 6 together with FIGS. 1 to 5, in order to program the nonvolatile memory device, a program voltage Vpp is applied to the well bias line WBL and 0 V is applied to the tunneling line TNL. For example, the program voltage Vpp may be about 6 V. As the program voltage Vpp is applied to the well bias line WBL, the second pn diode D2 and the third pn diode D3 enter a forward bias state. Accordingly, without considering a voltage drop in the diodes, the program voltage Vpp may be applied to the bit line BL and the source line SL. In an embodiment of the present program operation process, no separate bias is applied to the bit line BL and the source line SL.

When the program voltage Vpp is applied to the well bias line WBL, the program voltage Vpp is also applied to the first well region 112 through the first contact region 118. Accordingly, a coupling voltage is induced to the single-layer gate 130 through the coupling capacitor Ccp. The coupling voltage may be decided by a coupling ratio of the coupling capacitor Ccp. For example, when the coupling ratio of the coupling capacitor Ccp is 0.9 and the program voltage Vpp is 6 V, a coupling voltage of 5.4 V is induced to the single-layer gate 130.

As the coupling voltage is induced to the single-layer gate 130 and 0 V is applied to the tunneling line TNL, a voltage difference corresponding to the coupling voltage is generated between both ends of the tunneling capacitor Ctn in the tunneling capacitor area 120. By the voltage difference, electrons in the second contact region 124 tunnel the gate insulating layer 150 through an F-N tunneling mechanism, and are stored in the single-layer gate 130. As the electrons are stored in the single-layer gate 130, a threshold voltage of the read transistor Tr in the coupling capacitor/read transistor area 110 is increased to a predetermined value or more, so that the nonvolatile memory device enters a program state.

In order to erase the nonvolatile memory device, 0 V is applied to the well bias line WBL and an erase voltage Vee is applied to the tunneling line TNL. For example, the erase voltage Vee may be about 6 V. As the 0 V is applied to the well bias line WBL, a coupling voltage is not induced to the single-layer gate 130. Furthermore, as the erase voltage Vee is applied to the tunneling line TNL, the first pn diode D1 enters a forward bias state. Accordingly, without considering a voltage drop in the diode, the erase voltage Vee is applied to the second contact region 124. As the erase voltage Vee is applied to the second contact region 124, a voltage difference corresponding to the erase voltage Vee is generated between both ends of the tunneling capacitor Ctn in the tunneling capacitor area 120. By the voltage difference, electrons stored in the single-layer gate 130 tunnel the gate insulating layer 150 to the second contact region 124 through the F-N tunneling mechanism. As the electrons are discharged from the single-layer gate 130, the threshold voltage of the read transistor Tr in the coupling capacitor/read transistor area 110 is decreased to a predetermined value or less, so that the nonvolatile memory device enters an erase state.

In order to read the nonvolatile memory device, 0 V is applied to the well bias line WBL and the tunneling line TNL. Then, a bit line voltage Vdd is applied to the bit line BL and 0 V is applied to the source line SL. Under the bias voltage conditions as described above, the read transistor Tr is not turned on when the threshold voltage of the read transistor Tr is high, that is, in the program state, so that no current flows between the bit line BL and the source line SL. Furthermore, when the threshold voltage of the read transistor Tr is low, that is, in the erase state, the read transistor Tr is turned on, so that current flows between the bit line BL and the source line SL. Accordingly, the state of the nonvolatile memory device may be read by sensing whether current flows between the bit line BL and the source line SL.

Figure 7:
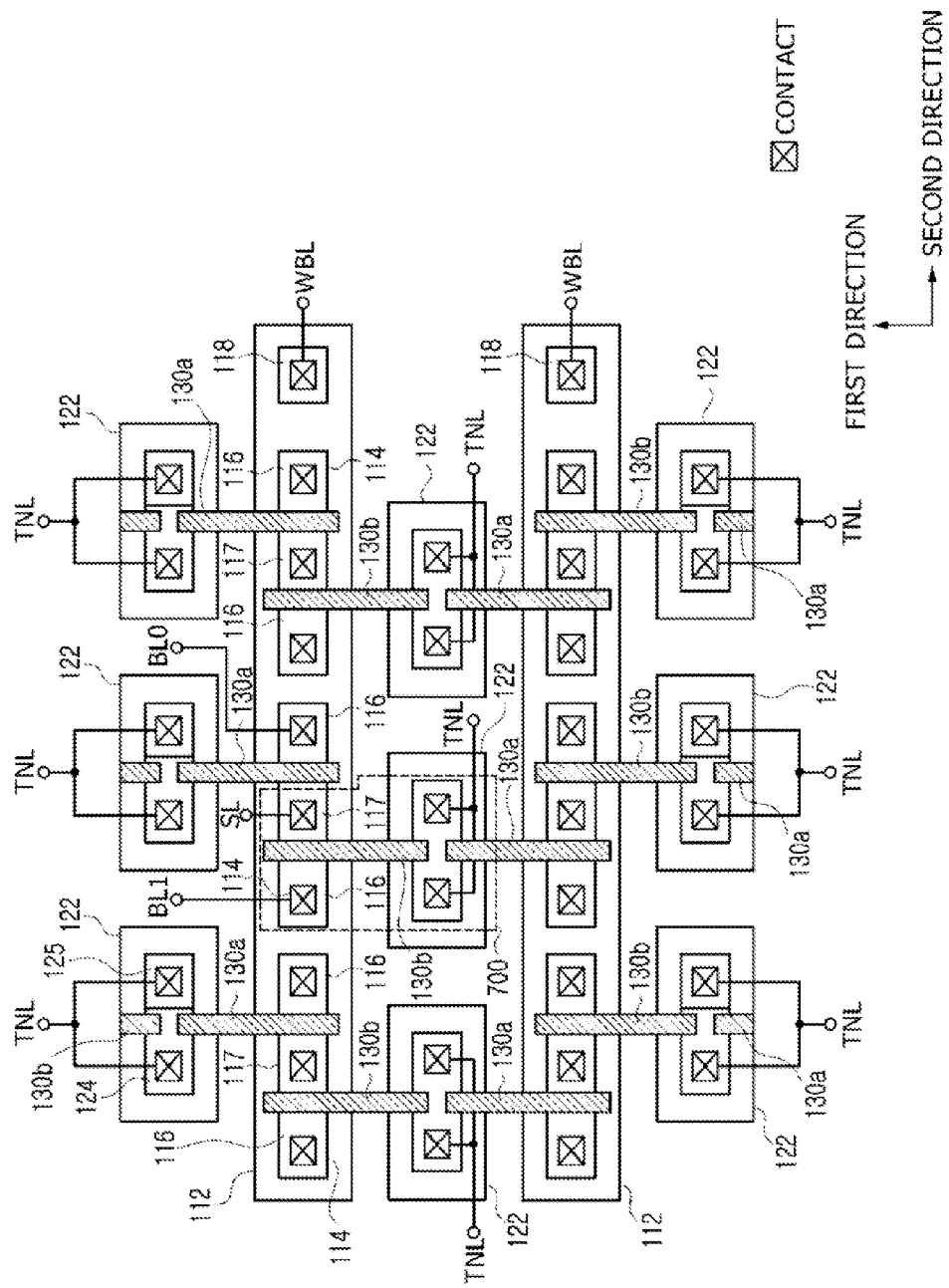
FIG. 7 is a layout diagram of a cell array of a nonvolatile memory device according to an embodiment of the present disclosure.

FIG. 7 is a layout diagram of a cell array of the nonvolatile memory device according to an embodiment of the present invention. In the present layout diagram, the nonvolatile memory device has a structure in which unit cells 700 are repeatedly arranged by a predetermined rule, wherein the sectional structure and the equivalent circuit diagram of the unit cell 700 are the same as described with reference to FIGS. 2 to 4 and FIG. 5.

Referring to FIG. 7, a plurality of first well regions 112 are arranged to extend in the second direction that is a horizontal direction in FIG. 7. Each first well region 112 has a p-type conductivity. The first well regions 112 are arranged in the first direction, which is a vertical direction in FIG. 7, to be spaced apart from one another. The first well regions 112 overlap ends of a plurality of single-layer gates 130a, 130b extending in the first direction. Between the plurality of first well regions 112 in the first direction, a plurality of second well regions 122 are arranged in the second direction to be spaced apart from one another. The second well regions 122 are spaced at a predetermined distance apart from the first well regions 112, which are adjacent in the first direction and a direction opposite to the first direction.

A plurality of active areas 114 are arranged in the second direction to be spaced apart from one another in each first well region 112. In the present embodiment, three active areas 114 are arranged in each first well region 112. However, this is for illustrative purposes only and the present disclosure is not limited thereto. A first contact region 118 is arranged at one end in the second direction of the first well region 112 to be spaced apart from the active area 114. First contact regions 118 are electrically coupled to the well bias line WBL through contacts. The first contact region 118 has a p$^+$-type conductivity. A second contact region 124 and a third contact region 125 are arranged in each second well region 122. The second contact region 124 and the third contact region 125 have n$^+$-type and p$^+$-type conductivities, respectively. As described with reference to FIG. 1, the second contact region 124 and the third contact region 125 may be arranged to have junction parts in contact with each other. Accordingly, the second contact region 124 and the third contact region 125 are electrically coupled to one tunneling line TNL through contacts.

Each of the active areas 114 crosses two single-layer gates 130a and 130b. One of the two single-layer gates 130a and 130b extends toward the first direction and the other one extends toward a direction opposite to the first direction from the active area 114. For a simple description, the single-layer gate 130a extending toward the first direction is defined as a "first single-layer gate", and the single-layer gate 130b extending toward the direction opposite to the first direction is defined as a "second single-layer gate". One end of the first single-layer gate 130a overlaps the active area 114 and the other end of the first single-layer gate 130a overlaps the second contact region 124 in the second well region 122 adjacent in the first direction. One end of the second single-layer gate 130b overlaps the active area 114 and the other end of the second single-layer gate 130b overlaps the second contact region 124 in the second well region 122 adjacent in the direction opposite to the first direction. One second contact region 124 commonly overlaps the first single-layer gate 130a and the second single-layer gate 130b.

The drain region 116 is arranged in the active area 114 at one side of the first single-layer gate 130a and the second single-layer gate 130b, and the source region 117 is arranged in the active area 114 between the first single-layer gate 130a and the second single-layer gate 130b. The source region 117 is commonly used in a unit cell including the first single-layer gate 130a and a unit cell including the second single-layer gate 130b. The drain region 116 and the source region 117 have n$^+$-type conductivities, respectively. The drain region 116 arranged in the active area 114 at one side of the first single-layer gate 130a is electrically coupled to a bit line BL0 through a contact. The drain region 116 arranged in the active area 114 at one side of the second single-layer gate 130b is electrically coupled to a bit line BL1 through a contact. The source region 117 is electrically coupled to the source line SL through a contact.

FIG. 8 is a table for explaining an operation method of the cell array of the nonvolatile memory device of FIG. 7. Referring to FIG. 8 together with FIG. 7, in order to program a unit cell 700 selected from among a plurality of unit cells constituting the cell array of the nonvolatile memory device, the program voltage Vpp and 0 V are applied to a well bias line WBL and a tunneling line TNL connected to the selected unit cell 700, respectively. Other well bias lines WBL and tunneling lines TNL not connected to the selected unit cell 700 are all floated. For example, the program voltage Vpp may be about 6 V. As the program voltage Vpp is applied to the well bias line WBL, the selected unit cell 700 is programmed through the F-N tunneling mechanism as described with reference to FIG. 6.

Other unit cells sharing the well bias line WBL with the selected unit cell 700, that is, other unit cells sharing the same first well region 112 are not programmed because the tunneling line TNL thereof is floated. Similarly, other unit cells sharing the tunneling line TNL with the selected unit cell 700, that is, other unit cells sharing the same second contact region 124 are not programmed because the well bias line WBL thereof is floated. In a program process for the selected unit cell 700, no separate bias voltage is applied to the bit lines BL0 and BL1 and the source line SL.

In order to erase the unit cell 700 selected from among the plurality of unit cells constituting the cell array of the nonvolatile memory device, 0 V and the erase voltage Vee are applied to the well bias line WBL and the tunneling line TNL connected to the selected unit cell 700, respectively. Other well bias lines WBL and tunneling lines TNL not connected to the selected unit cell 700 are all floated. For example, the erase voltage Vee may be about 6 V. As the erase voltage Vee is applied to the tunneling line TNL, the selected unit cell 700 is erased through the F-N tunneling mechanism as described with reference to FIG. 6.

Other unit cells sharing the well bias line WBL with the selected unit cell 700, that is, other unit cells sharing the same first well region 112 are not erased because the tunneling line TNL thereof is floated. Similarly, other unit cells sharing the tunneling line TNL with the selected unit cell 700, that is, other unit cells sharing the same second contact region 124 are not erased because the well bias line WBL thereof is floated. In the present embodiment, the method of erasing only the selected unit cell 700 is described, but 0 V is applied to all well bias lines WBL and the erase voltage Vee is applied all tunneling lines TNL, so that the unit cells may be erased on the basis of blocks of the unit cells.

In order to read the unit cell 700 selected from among the plurality of unit cells constituting the cell array of the nonvolatile memory device, 0 V is applied to the well bias line WBL and the tunneling line TNL connected to the selected unit cell 700. The bit line voltage Vdd and 0 V are applied to a bit line BL1 and a source line SL connected to the selected unit cell 700. Other bit lines BL0 and source lines SL not connected to the selected unit cell 700 are all floated. Furthermore, other well bias lines WBL and tunneling lines TNL not connected to the selected unit cell 700 are all floated. For example, the bit line voltage Vdd may be about 1.2 V. As 0 V is applied to the well bias line WBL and the tunneling line TNL connected to the selected unit cell 700, and the bit line voltage Vdd and 0 V are applied to the bit line BL1 and the source line SL, the state of the selected unit cell 700 may be determined by sensing current flow of the selected unit cell 700 as described with reference to FIG. 6.

Other unit cells sharing the bit line BL with the selected unit cell 700 are not subject to a read operation because the source line SL thereof is floated. Other unit cells sharing the source line SL with the selected unit cell 700 are not subject to the read operation because the bit line BL0 thereof is floated. Furthermore, other unit cells sharing the tunneling line TNL with the selected unit cell 700, that is, other unit cells sharing the same second contact region 124 are not subject to the read operation because the well bias line WBL, the bit lines BL0 and BL1, and the source line SL thereof are all floated.

The embodiments of the inventive concept have been disclosed above for illustrative purposes. Those skilled in the art will appreciate that various modifications, additions, and substitutions are possible, without departing from the scope and spirit of the inventive concept as disclosed in the accompanying claims.

What is claimed is:

1. A nonvolatile memory device comprising:
    a single-layer gate;
    a first area including a first well region, a first contact region arranged in the first well region, and source and drain regions arranged at both sides of the single-layer gate in the first well region; and
    a second area including a second well region, a second contact region arranged to overlap a part of the single-layer gate in the second well region, and a third contact region arranged in the second well region,
    wherein the first and second well regions and the first and third contact regions have a first conductivity while the second contact region and the source and drain regions have a second conductivity.

2. The nonvolatile memory device of claim 1, wherein an impurity doping concentration of the first contact region is higher than an impurity doping concentration of the first well region.

3. The nonvolatile memory device of claim 1, wherein an impurity doping concentration of the third contact region is higher than an impurity doping concentration of the second well region.

4. The nonvolatile memory device of claim 1, wherein a first end and a second end of the single-layer gate overlap the first well region and the second contact region, respectively.

5. The nonvolatile memory device of claim 1, wherein the second contact region and the third contact region have junction parts in contact with each other.

6. The nonvolatile memory device of claim 5, wherein the second contact region and the third contact region are connected to a same bias application line.

7. The nonvolatile memory device of claim 1, wherein the first conductivity is a p-type and the second conductivity is an n-type.

8. The nonvolatile memory device of claim 1, wherein the first area includes:
    a coupling capacitor suitable for inducing a coupling voltage to the single-layer gate in program and erase operations; and
    a read transistor suitable for performing a read operation.

9. The nonvolatile memory device of claim 1, wherein the second area includes a tunneling capacitor suitable for performing charge tunneling between the single-layer gate and the second contact region in program and erase operations.

10. A nonvolatile memory device comprising:
    a single-layer gate;
    a tunneling line connected to the single-layer gate through a tunneling capacitor and a first diode;
    a well bias line connected to the single-layer gate through a coupling capacitor; and
    a bit line and a source line connected to the well bias line through a second diode and a third diode, respectively.

11. The nonvolatile memory device of claim 10, wherein an anode and a cathode of the first diode are connected to the tunneling line and the tunneling capacitor, respectively.

12. The nonvolatile memory device of claim 10, wherein an anode and a cathode of the second diode are connected to the well bias line and the bit line, respectively.

13. The nonvolatile memory device of claim 10, wherein an anode and a cathode of the third diode are connected to the well bias line and the source line, respectively.

14. A method of operating a nonvolatile memory device including a unit cell of a single-layer gate, the method comprising:
    performing program and erase operations of the unit cell by applying first voltages to a well bias line connected to the single-layer gate through a coupling capacitor and a tunneling line connected to the single-layer gate through a tunneling capacitor and a first diode; and
    performing a read operation of the unit cell by applying second voltages to the well bias line, the tunneling line, and bit and source lines connected to the well bias line through a second and a third diode, respectively.

15. The method of claim 14, wherein the performing of the program and erase operations includes:
    applying a program voltage and 0 V to the well bias line and the tunneling line, respectively, to perform the program operation; and
    applying 0 V and an erase voltage to the well bias line and the tunneling line, respectively, to perform the erase operation.

16. The method of claim 14, wherein the performing of the read operation includes:
    applying 0 V to the well bias line and the tunneling line; and
    applying a bit line voltage and 0 V to the bit line and the source line, respectively.

17. A cell array of a nonvolatile memory device, comprising:
    a plurality of first well regions arranged in a first direction to be spaced apart from each other, while extending in a second direction;
    a plurality of active areas arranged in the second direction to be spaced apart from each other in each of the plurality of first well regions;
    a source region and a drain region arranged in each of the active areas;
    a first contact region arranged to be spaced apart from the active areas in each of the plurality of first well regions;
    a plurality of second well regions arranged in the second direction between the first well regions to be spaced apart from each other;
    a second contact region and a third contact region arranged in each of the second well regions; and
    a single-layer gate extending in the first direction to overlap the first well region at a first end thereof and the second contact region at a second end thereof.

18. The cell array of the nonvolatile memory device of claim 17, wherein the first well regions, the first contact region, the second well regions, and the third contact region have a first conductivity, and the drain region, the source region, and the second contact region have a second conductivity.

19. The cell array of the nonvolatile memory device of claim 17, wherein the single-layer gate includes:
    a first single-layer gate extending in the first direction from one of the active areas in the first well region to a second contact region in one of the second well regions; and a second single-layer gate extending in the first direction from a second contact region in another of the second well regions to the one of the active areas.

20. The cell array of the nonvolatile memory device of claim 17, wherein the first contact region is connected to a well bias line, the second contact region and the third contact region are connected to a tunneling line, and the drain region and the source region are connected to a bit line and a source line, respectively.

* * * * *